United States Patent
Jiang et al.

(10) Patent No.: US 7,298,173 B1
(45) Date of Patent: Nov. 20, 2007

(54) SLEW RATE CONTROL CIRCUIT FOR SMALL COMPUTER SYSTEM INTERFACE (SCSI) DIFFERENTIAL DRIVER

(75) Inventors: Bin Jiang, Singapore (SG); Sang Kong Chan, Singapore (SG)

(73) Assignee: Marvell International Ltd., Hamilton (BM)

( * ) Notice: Subject to any disclaimer, the term of this patent is extended or adjusted under 35 U.S.C. 154(b) by 211 days.

(21) Appl. No.: 11/122,444

(22) Filed: May 5, 2005

Related U.S. Application Data

(60) Provisional application No. 60/622,195, filed on Oct. 26, 2004.

(51) Int. Cl.
 *H03K 19/0175* (2006.01)
(52) U.S. Cl. .......................................... 326/83; 326/82
(58) Field of Classification Search ................. 326/82, 326/83
 See application file for complete search history.

(56) References Cited

U.S. PATENT DOCUMENTS

| | | | |
|---|---|---|---|
| 3,543,009 A | 11/1970 | Voelcker, Jr. | |
| 4,112,253 A | 9/1978 | Wilhelm | |
| 4,131,767 A | 12/1978 | Weinstein | |
| 4,152,541 A | 5/1979 | Yuen | |
| RE30,111 E | 10/1979 | Blood, Jr. | |
| 4,362,909 A | 12/1982 | Snijders et al. | |
| 4,393,494 A | 7/1983 | Belforte et al. | |
| 4,727,566 A | 2/1988 | Dahlqvist | |
| 4,888,762 A | 12/1989 | Arai | |
| 4,935,919 A | 6/1990 | Hiraguchi | |
| 4,947,171 A | 8/1990 | Pfeifer et al. | |
| 4,999,830 A | 3/1991 | Agazzi | |
| 5,222,084 A | 6/1993 | Takahashi | |
| 5,305,379 A | 4/1994 | Takeuchi | |
| 5,307,405 A | 4/1994 | Sih | |
| 5,323,157 A | 6/1994 | Ledzius et al. | |
| 5,357,145 A | 10/1994 | Segaram | |
| 5,388,092 A | 2/1995 | Koyama et al. | |
| 5,418,478 A | 5/1995 | Van Brunt et al. | |

(Continued)

FOREIGN PATENT DOCUMENTS

DE   10 2004 017 497   11/2004

(Continued)

OTHER PUBLICATIONS

U.S. Appl. No. 60/106,265, filed Oct. 30, 1998, Chan.

(Continued)

*Primary Examiner*—Rexford Barnie
*Assistant Examiner*—Thienvu Tran

(57) ABSTRACT

A small computer system interface (SCSI) driver circuit having a programmable slew rate comprises N cascaded delay cells each including a data bit input, a delayed data bit output that communicates with the data bit input of an adjacent one of the N cascaded delay cells, and a delay time input that receives a programmable delay time value for setting a variable delay between receiving data at the data bit input and generating the delayed data bit output. N predrivers receive an output enable signal and a corresponding one of the N delayed data bit outputs and generate a predriver output signal based on the output enable and the corresponding one of the N delayed data bit outputs. N drivers have inputs that receive predriver output signals from corresponding ones of the N predrivers. An output port communicates with outputs of the N drivers.

40 Claims, 6 Drawing Sheets

U.S. PATENT DOCUMENTS

| | | | |
|---|---|---|---|
| 5,465,272 A | 11/1995 | Smith | |
| 5,471,665 A | 11/1995 | Pace et al. | |
| 5,489,873 A | 2/1996 | Kamato et al. | |
| 5,508,656 A | 4/1996 | Jafford et al. | |
| 5,517,141 A | 5/1996 | Abdi et al. | |
| 5,517,435 A | 5/1996 | Sugiyama | |
| 5,539,773 A | 7/1996 | Knee et al. | |
| 5,572,158 A | 11/1996 | Lee et al. | |
| 5,587,681 A | 12/1996 | Fobbester | |
| 5,596,439 A | 1/1997 | Dankberg et al. | |
| 5,625,357 A | 4/1997 | Cabler | |
| 5,648,738 A | 7/1997 | Welland et al. | |
| 5,651,029 A | 7/1997 | Yang et al. | |
| 5,659,609 A | 8/1997 | Koizumi et al. | |
| 5,663,728 A | 9/1997 | Essenwanger | |
| 5,666,354 A | 9/1997 | Cecchi et al. | |
| 5,757,219 A | 5/1998 | Weedon et al. | |
| 5,796,725 A | 8/1998 | Muraoka | |
| 5,798,664 A | 8/1998 | Nagahari et al. | |
| 5,822,426 A | 10/1998 | Rasmus et al. | |
| 5,825,819 A | 10/1998 | Cogburn | |
| 5,844,439 A | 12/1998 | Zortea | |
| 5,864,587 A | 1/1999 | Hunt | |
| 5,880,615 A | 3/1999 | Bazes | |
| 5,936,450 A | 8/1999 | Unger | |
| 5,940,442 A | 8/1999 | Wong et al. | |
| 5,940,498 A | 8/1999 | Bardl | |
| 6,043,766 A | 3/2000 | Hee et al. | |
| 6,044,489 A | 3/2000 | Hee et al. | |
| 6,067,327 A | 5/2000 | Creigh et al. | |
| 6,121,831 A | 9/2000 | Mack | |
| 6,140,857 A | 10/2000 | Bazes | |
| 6,148,025 A | 11/2000 | Shirani et al. | |
| 6,172,634 B1 | 1/2001 | Leonowich et al. | |
| 6,185,263 B1 | 2/2001 | Chan | |
| 6,188,282 B1 | 2/2001 | Montalvo | |
| 6,249,164 B1 | 6/2001 | Cranford, Jr. et al. | |
| 6,259,680 B1 | 7/2001 | Blackwell et al. | |
| 6,259,745 B1 | 7/2001 | Chan | |
| 6,275,098 B1 | 8/2001 | Uehara et al. | |
| 6,288,604 B1 | 9/2001 | Shih et al. | |
| 6,332,004 B1 | 12/2001 | Chan | |
| RE37,619 E | 4/2002 | Mercer et al. | |
| 6,373,908 B2 | 4/2002 | Chan | |
| 6,389,077 B1 | 5/2002 | Chan | |
| 6,411,647 B1 | 6/2002 | Chan | |
| 6,433,608 B1 | 8/2002 | Huang | |
| 6,462,688 B1 | 10/2002 | Sutardja | |
| 6,477,200 B1 | 11/2002 | Agazzi et al. | |
| 6,509,857 B1 | 1/2003 | Nakao | |
| 6,570,931 B1 | 5/2003 | Song | |
| 6,594,304 B2 | 7/2003 | Chan | |
| 6,597,233 B2 | 7/2003 | Ray | |
| 6,687,286 B1 | 2/2004 | Leonowich et al. | |
| 6,690,742 B2 | 2/2004 | Chan | |
| 6,710,617 B2 * | 3/2004 | Humphrey | 326/30 |
| 6,744,831 B2 | 6/2004 | Chan | |
| 6,882,216 B2 | 4/2005 | Kang | |
| 2001/0050585 A1 | 12/2001 | Carr | |
| 2002/0136321 A1 | 9/2002 | Chan | |
| 2002/0181601 A1 | 12/2002 | Huang et al. | |
| 2003/0002570 A1 | 1/2003 | Chan | |
| 2004/0005015 A1 | 1/2004 | Chan | |
| 2004/0090981 A1 | 5/2004 | Lin et al. | |
| 2004/0091071 A1 | 5/2004 | Lin et al. | |
| 2004/0105504 A1 | 6/2004 | Chan | |
| 2004/0208312 A1 | 10/2004 | Okuda | |
| 2005/0025266 A1 | 2/2005 | Chan | |
| 2006/0038596 A1 * | 2/2006 | Wang | 327/158 |

FOREIGN PATENT DOCUMENTS

| | | |
|---|---|---|
| EP | 0 800 278 | 8/1997 |
| JP | 58-111415 | 7/1983 |
| JP | 3-273704 | 12/1991 |
| JP | 4-293306 | 10/1992 |
| JP | 4-351109 | 12/1992 |
| JP | 7-131260 | 5/1995 |
| JP | 10-126183 | 5/1998 |
| TW | 0497334 | 8/2002 |
| TW | 0512608 | 12/2002 |
| TW | 0545016 | 8/2003 |
| WO | WO 99/46867 | 9/1999 |
| WO | WO 00/27079 | 5/2000 |
| WO | WO 00/28663 | 5/2000 |
| WO | WO 00/28668 | 5/2000 |
| WO | WO 00/28691 | 5/2000 |
| WO | WO 00/28712 | 5/2000 |
| WO | WO 00/35094 | 6/2000 |

OTHER PUBLICATIONS

Bertolaccini, Mario, et al., A Precision Baseline Offset and Drift Corrector for Low-Frequency Applications, IEEE Transactions on Instrumentation and Measurement, vol. IM-34, No. 3, Sep. 1985, pp. 405-412.

Everitt, James, et al., "A CMOS Transceiver for 10-Mb/s and 100-Mb/s Ethernet," IEEE Journal of Solid_State Circuits, vol. 33, No. 12, Dec. 1998, pp. 2169-2177.

Gigabit Ethernet Alliance, "Gigabit Ethernet 1000BASE-T Whitepaper", copyright 1997.

Goldberg, Lee, "Gigabit Ethernet PHY Chip Sets LAN Speed Record for CopperStory," TECH Insights, Nov. 16, 1998.

H4000 Digital Ethernet Transceiver Technical Manual, Distributed Systems, Chapter 3, pp. 3-1 to 3-11, copyright 1982 by Digital Equipment Corporation.

IEEE Standards 802.3ab-2002, "Part 3: Carrier sense multiple access with collision detection (CSMA/CD) access method and physical layer specifications", pp. 147-249.

Kelly, N. Patrick, et al., "WA 18.5—A Mixed-Signal DFE/FFE Receiver for 100Base-TX Applications," ISSCC 2000/Session 18/Wireline Communications/Paper WA 18.5, 2000 IEEE International Solid-State Circuits Conference, pp. 310-311.

Linear Technology, High Speed Modem Solutions, InfoCard 20, Linear Technology Corporation, no date.

Linear Technology, LT1355/LT1356, Dual and Quad 12MHz, 400V/us Op Amps, Linear Technology Corporation, pp. 1-16, no date.

Linear Technology, LT1358/LT 1359, Dual and Quad 25MHz, 600V/us Op Amps, Linear Technology Corporation, pp. 1-12, no date.

Linear Technology, LT1361/LT 1362, Dual and Quad 50MHz, 800V/us Op Amps, Linear Technology Corporation, pp. 1-12, no date.

Linear Technology, LT1364/LT 1365, Dual and Quad 70MHz, 1000V/us Op Amps, Linear Technology Corporation, pp. 1-12, no date.

Linear Technology, LT1813/LT 1814, Dual and Quad 3mA, 100MHz, 750V/us Operational Amplifiers, Linear Technology Corporation, pp. 1-16, no date.

Mueller, K.H., "Combining Echo Cancellation and Decision Feedback Equalization," The Bell System Technical Journal, vol. 58, No. 2, Feb. 1979, pp. 491-500.

Sedra, Adel S and Smith, Kenneth C. "Microelectronic Circuits". Saunders College Publishing, Third Edition, Chapter 2, Section 2.4, 1991, pp. 61-63.

Song, Bang-Sup, et al., "FP 12.1: NRZ Timing Recovery Technique for Band-Limited Channels," ISSCC 96/Session 12/Serial Data Communications/Paper FP 12.1, 1996 IEEE International Solid State Circuits Conference pp. 194-196.

Stonick, John T. et al., "An Adaptive PAM-4 5-Gb/s Backplane Transceiver in .025- um CMOS." IEEE Journal of Solid State Circuits, vol. 38, No. 3, Mar. 2003.

The Electrical Engineering Handbook, Chapter 31, "D/A and A/D Converters," Richard C. Dorf, editor, CRC Press 1993.

Uda, et al., "125Mbit/s Fiber Optic Transmitter/Receiver with Duplex Connector", Fiber Optic Communications Development Div., NEC Corporation, NEC Engineering, Ltd. and English Language Translation, no date.

Yamaguchi, et al., "400Mbit/s Submarine Optical Repeater Using Integrated Circuits," Fujitsu Laboratories, Ltd. and English Language Translation, no date.

* cited by examiner

SLEW RATE CONTROL CIRCUIT FOR SMALL COMPUTER SYSTEM INTERFACE (SCSI) DIFFERENTIAL DRIVER

CROSS-REFERENCE TO RELATED APPLICATIONS

This application claims priority of U.S. Provisional Patent Application Ser. No. 60/622,195, filed on Oct. 26, 2004, which is hereby incorporated herein by reference in its entirety.

FIELD OF THE INVENTION

The present invention relates to electrical circuits that provide an output port having a programmable slew rate.

BACKGROUND OF THE INVENTION

Referring now to FIG. 1, a computer system 10 is shown. A plurality of computing devices 12-1, 12-2, ..., 12-M, collectively referred to as computing devices 12, are connected by a communication cable 14. The communication cable 14 connects to differential signal bus interfaces 16-1, 16-2, ..., 16-M, such as small computer system interfaces (SCSI interfaces), associated with respective computing devices 12. The interfaces 16-1, 16-2, ..., 16-M are collectively referred to as the interfaces 16. The computing devices 12 may include a host controller, disk drive and/or any other device having a compatible SCSI interface. Terminators T-1 and T-2 include terminating bias resistors 18-1 and 18-2, referred to collectively as bias resistors 18, which are connected across conductors at opposite ends of the communication cable 14. In some applications, a single terminator T is used at one end of the communication cable 14. In practice, a plurality of cables 14 and terminating bias resistors 18 would connect the interfaces 16 to form a parallel data bus 20. The data bus 20 may have several channels that each carry a bit of data per cycle. The data bus 20 may include additional channels for control signals. For purposes of clarity, only one channel of the parallel data bus 20 is described herein.

Turning now to FIG. 2, an output driver 22 of the prior art is shown. The output driver 22 provides an output port 24 that connects to the communication cable 14 and the bias resistor 18. A p-channel field effect transistor (PFET) Q1 has a gate connected to a PFET predriver 26. A drain of the PFET Q1 is connected to a voltage source VDD. A source of the PFET Q1 is connected to a drain of an n-channel field effect transistor (NFET) Q2. A gate of the NFET Q2 is connected to an NFET predriver 28. A source of the NFET Q2 is connected to a reference voltage VSS. The connection between the source of the PFET Q1 and the drain of the NFET Q2 provides one node of the output port 24. A PFET Q3 has a gate connected to a PFET predriver 30. A drain of the PFET Q3 is connected to the voltage source VDD. A source of the PFET Q3 is connected to a drain of an NFET Q4. A gate of the NFET Q4 is connected to an NFET predriver 32. A source of the NFET Q4 is connected to the reference voltage VSS. The connection between the source of the PFET Q3 and the drain of the NFET Q4 provides the second node of the output port 24. Such an arrangement of the PFETs and NFETs Q1-Q4 may be referred to as an "H-bridge."

When the PFET Q1 and the NFET Q4 are turned on, and the PFET Q3 and the NFET Q2 are turned off, then current flows in a first direction through the output port 24. When the PFET Q1 and the NFET Q4 are turned off, and the PFET Q3 and the NFET Q2 are turned on, then current flows in a second direction through the output port 24. As the current flows through the output port 24 in the first and second directions, high and low voltages are developed across the bias resistor 18. The high and low voltages typically range from +0.5V to 0.5V, and provide a data signal representing digital ones and zeros on the communication cable 14. Drive voltages applied to the gates of the PFETS and NFETS Q1-Q4 by the PFET and NFET predrivers 26, 28, 30, and 32, may be adjusted. The drive voltages determine a slew rate during transitions between the high and low voltages across the bias resistor 18. Such a configuration is described in U.S. Pat. No. 6,597,233, the specification of which is incorporated herein by reference. While the output port 24 of the prior art provides an adjustable slew rate, the actual slew rate obtained may vary undesirably depending on variables such as a length of the communication cable 14 and manufacturing variables of the PFETs and NFETs Q1-Q4.

SUMMARY OF THE INVENTION

A small computer system interface (SCSI) driver circuit having a programmable slew rate comprises N cascaded delay cells each including a data bit input, a delayed data bit output that communicates with the data bit input of an adjacent one of the N cascaded delay cells, and a delay time input that receives a programmable delay time value for setting a variable delay between receiving data at the data bit input and generating the delayed data bit output. N predrivers receive an output enable signal and a corresponding one of the N delayed data bit outputs and generate a predriver output signal based on the output enable and the corresponding one of the N delayed data bit outputs. N drivers have inputs that receive predriver output signals from corresponding ones of the N predrivers. An output port communicates with outputs of the N drivers.

In other features, a delay control module generates the delay times for the N cascaded delay cells. A bit of data input to a first of the N data bit inputs cascades through the N cascaded delay cells. The N drivers sequentially respond to the outputs of the N predrivers to provide the predetermined slew rate at the output port. The delay control module includes a digital-to-analog converter (DAC) that receives a digital delay signal and that generates an analog delay signal and a bias generator that receives the analog delay signal and that biases the N cascaded delay cells.

In still other features, each of the N cascaded delay cells further comprise a charge storage device that is charged by the output voltage and that provides the delay time. The charge storage device includes a capacitor. The N drivers include H-bridges. Each of the N drivers further comprises a current source. Each of the N drivers further comprises a reference current source that provides a reference current for the current sources. A computing device comprises a plurality of the SCSI drivers. Each of the N predrivers includes an enable input, a predriver output, and a mapping circuit that maps a corresponding one of the N delayed data bit outputs and the enable input to a corresponding predriver output signal.

Further areas of applicability of the present invention will become apparent from the detailed description provided hereinafter. It should be understood that the detailed description and specific examples, while indicating the preferred embodiment(s) of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
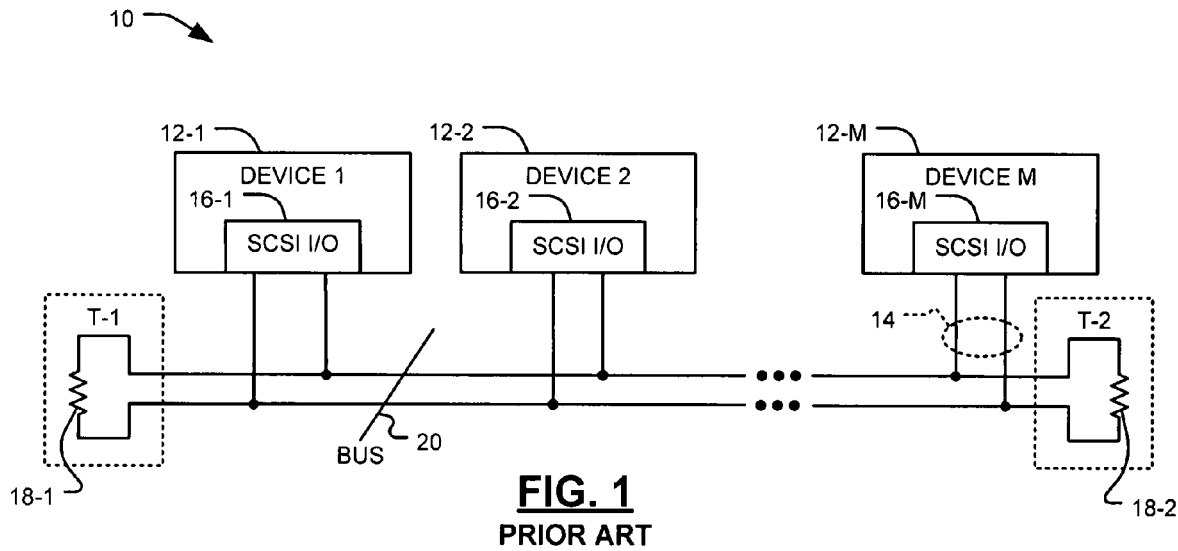
FIG. 1 is a functional block diagram of computing devices connected by a communication cable.
Figure 2:
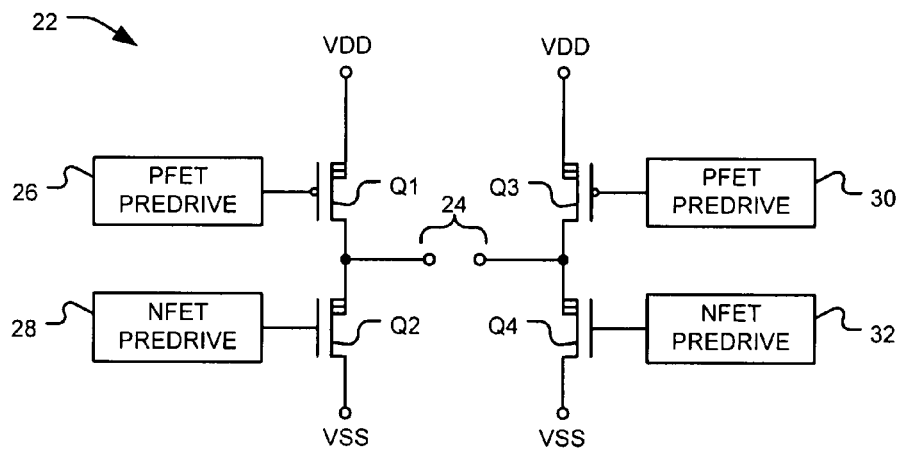
FIG. 2 is a schematic diagram of a driver of the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module and/or device refers to an Application Specific Integrated Circuit (ASIC), an electronic circuit, a processor (shared, dedicated, or group), and memory that execute one or more software or firmware programs, a combinational logic circuit, and/or other suitable components that provide the described functionality. For purposes of clarity, the same reference numerals will be used to identify similar elements. References to logical 1, true, and on are equivalent to each other, and references to logical 0, false, and off are equivalent to each other, unless otherwise noted. Parts or all of the invention may also be implemented with equivalent embodiments using logic that is inverted from that disclosed.

Figure 3:
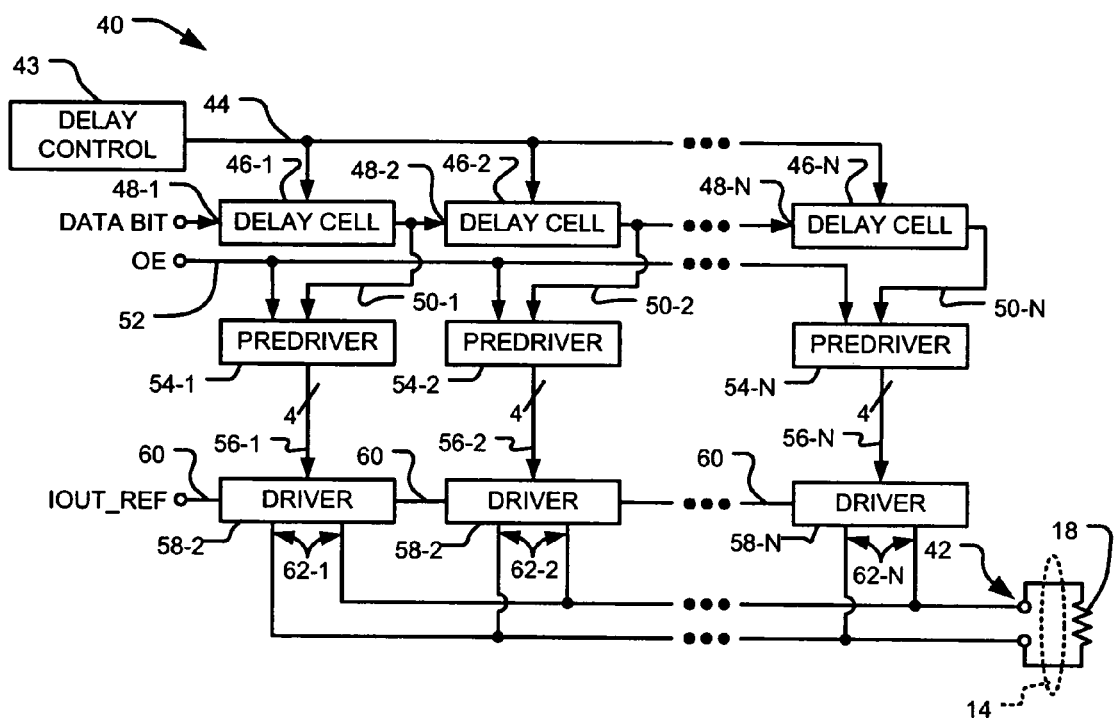
FIG. 3 is a functional block diagram of an output port circuit for connection to a communication bus.

Referring now to FIG. 3, an output port circuit 40 is shown. The output port circuit 40 is connected to the bias resistor 18 by the communication cable 14. An output port 42 provides an output signal having a predetermined slew rate. A delay setting module 43 programmably sets slew rate by applying a delay signal to a delay time input 44. The delay setting module 43 may program all of the delay modules individually to two or more delay values and/or collectively to a common delay value. 1 to N conductors may be used to connect the delay setting module to the delay to the delay cells 46. In some implementations, the delay time input 44 may be a 3-bit wide parallel binary input providing $2^3=8$ unique slew rates. Cascaded delay cells 46-1, 46-2, . . . , 46-N, referred to collectively as the cascaded delay cells 46, each receive the delay signal. Each of the cascaded delay cells 46 has an input 48-1, 48-2, . . . , 48-N, referred to collectively as the data inputs 48, that receive a data bit. Each of the cascaded delay cells 46 also has a delayed data output 50-1, 50-2, . . . , 50-N, referred to collectively as the delayed data outputs 50. Each of the data inputs 48-2 through 48-N is connected to a delayed data output 50-1, 50-2, 50-(N−1) of the preceding cascaded delay cell 46. The data input 48-1 of the first cascaded delay cell 46-1 receives a data bit from an associated computing device 12. Each cascaded delay cell 46 propagates its data bit from its input 48 to its delayed data output 50 after the delay time. Therefore, the data bit applied to the first input 48-1 propagates to the last delayed data output 50-N after N multiples of the delay time. In a preferred embodiment, N=8 and each cascaded delay cell 46 provides a delay time between about 125 picoseconds and 375 picoseconds. The preferred embodiment thereby provides a slew rate adjustable between about 1 nanosecond and 3 nanoseconds, although other delay ranges can be used.

An output enable line 52 is active high and connected to a plurality of predrivers 54-1, 54-2, . . . , 54-N, referred to collectively as the predrivers 54. Each of the predrivers 54 has a data input connected to the delayed data output 50 of a respective one of the cascaded delay cells 46. Each of the predrivers 54 implements a truth table, described later herein. The truth table uses the output enable line 52 and the delayed data output 50 to generate four output signals. The four output signals are communicated over output lines 56-1, 56-2, . . . , 56-N, referred to collectively as output lines 56, of each respective predriver 54.

The output lines 56 of each predriver 54 are connected to a respective driver 58-1, 58-2, . . . , 58-N, referred to collectively as the drivers 58. Each of the drivers 58 has an input for a reference current signal 60 and a driver output port 62. The driver output ports 62 are connected in parallel to form the output port 42. When the output enable line 52 is high, a data bit propagates through the cascaded delay cells 46 and causes the driver output ports 62 to turn on or off in succession. As each output port 62 turns on or off, a magnitude of a signal appearing at the output port 42 increases or decreases, respectively, thereby providing a predetermined slew rate.

Figure 4:
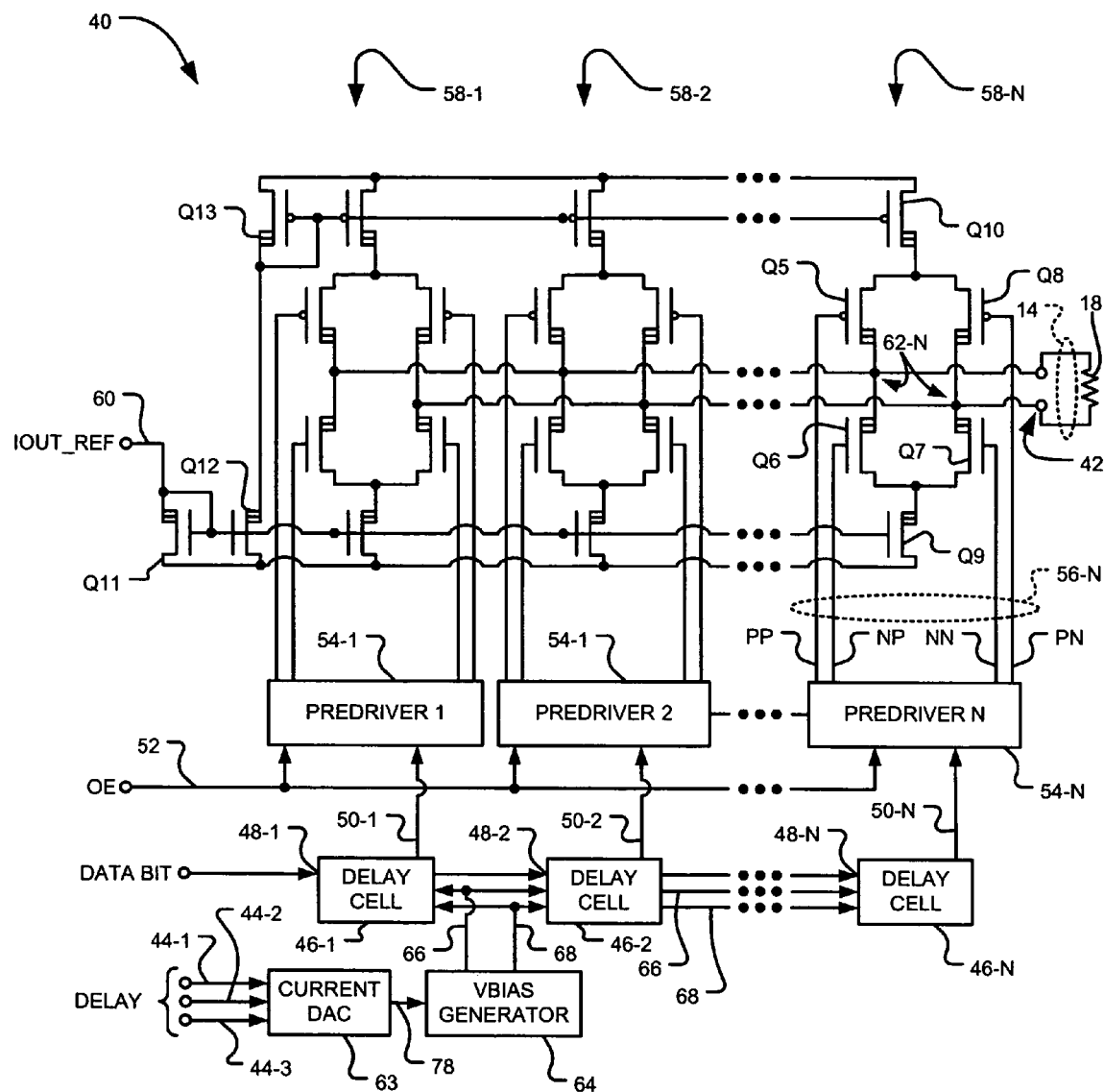
FIG. 4 is a schematic diagram of driver stages of an output port circuit.

Turning now to FIG. 4, a partial schematic diagram is shown of the output port circuit 40. The three lines of delay time input 44 are shown individually as 44-1, 44-2, and 44-3. The delay time input 44 is connected to a digital-to-analog converter (current DAC) 63. A current output of the DAC 63 is applied to a bias voltage generator 64. The DAC 63 receives the delay signal and converts it to a current as is described later. The bias voltage generator 64 converts the current to a positive bias voltage 66 and a negative bias voltage 68. The positive and negative bias voltages 66, 68 are applied to each of the cascaded delay cells 46. The cascaded delay cells 46 use the positive and negative bias voltages 66, 68 to operate internal circuitry as described later.

Circuitry of the drivers 58 will now be described. For the purpose of clarity, only the driver 58-N will be described. The four output signals 56 from the predriver 54 are connected to an H-bridge. An output signal PP is connected to a gate of a PFET Q5. An output signal NP is connected to a gate of an NFET Q6. An output signal NN is connected to a gate of an NFET Q7. An output signal PN is connected to a gate of a PFET Q8. A source of the NFET Q6 is connected to a source of the NFET Q7. A source of the PFET Q5 is connected to a source of PFET Q8. A drain of the NFET Q6 is connected to a drain of the PFET Q5 and provides a negative node of the driver output port 62. A drain of the NFET Q7 is connected to a drain of the PFET Q8 and provides a positive node of the driver output port 62. An NFET Q9 is configured as a current mirror and has a drain connected to the sources of the NFETs Q6 and Q7. A PFET Q10 is configured as a current mirror and has a drain connected to the sources of the PFETs Q5 and Q8.

A current source is formed from NFETs Q11, Q12, and a PFET Q13. A gate and a drain of the NFET Q11 are connected to the reference current source 60 and a gate of the NFET Q12. A source of the NFET Q11 is connected to a source of the NFET Q12. A drain of the NFET Q12 is connected to a drain and a gate of the PFET Q13. The sources of the NFETs Q11 and Q12 are connected to a source of each NFET Q9 in the drivers 58. A source of the PFET Q13 is connected to a source of each PFET Q10 in the drivers 58. The NFET Q12 and the PFET Q13 mirror the reference current signal 60 flowing through the NFET Q11 and provide current to the drivers 58. The NFET Q9 and PFET Q10 assure that the driver circuit output has a predetermined source impedance substantially free from influences resulting from process variations in manufacturing the NFETs and PFETs.

Figures 5, 6:
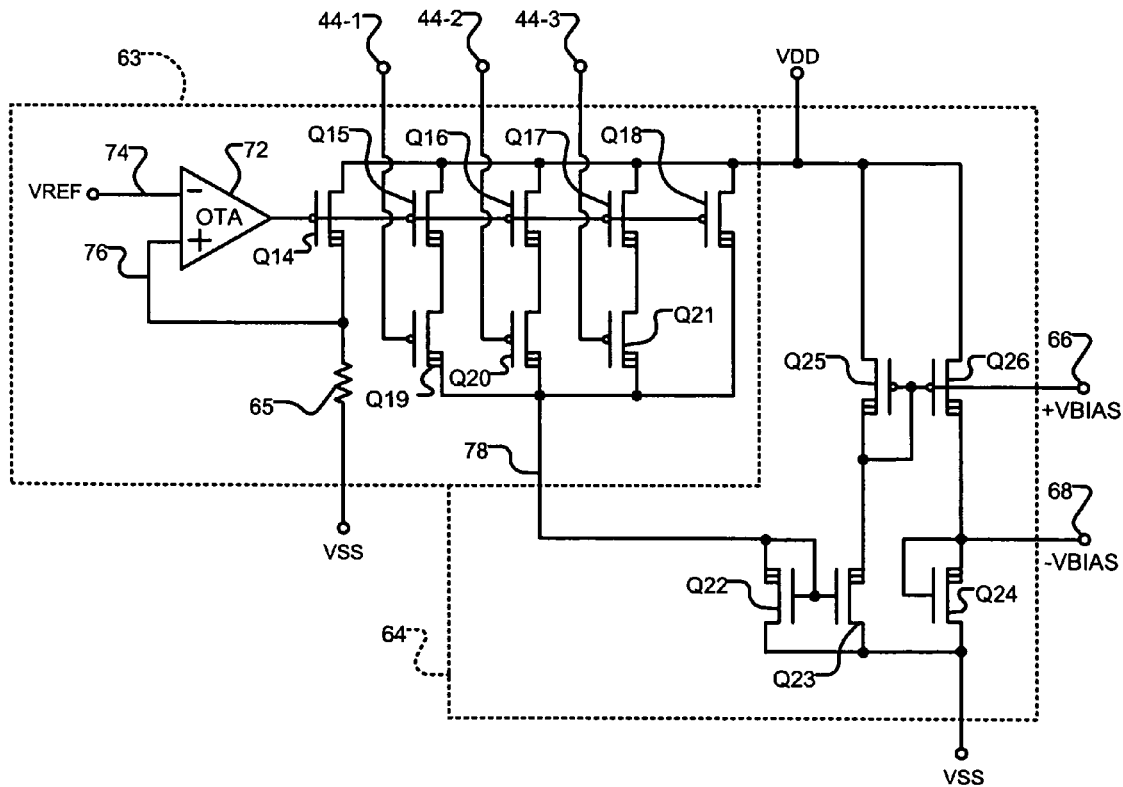
FIG. 5 is a truth table of a predriver stage.
FIG. 6 is a schematic diagram of a bias-voltage generator of a delay stage.

Turning now to FIG. 5, a truth table 70 is shown. The truth table 70 has a first input column for the delayed data bit appearing at the delayed data output 50. A second input column is has a state of the output enable (OE) line 52. Four predriver output columns are provided, one for each of the predriver output signals PP, NN, PN, and NP. Entries in the four columns parenthetically indicate whether the associated PFET or NFET Q5-Q8 is turned on or turned off. A rightmost output column indicates a logic state appearing at the driver output port 62. The OE line 52 is a active high signal. When the OE line 52 is low, or zero, the PFETs and NFETs Q5-Q8 are turned off and the driver output port 62 is electrically open (3-state). When the OE line 52 is high and the delayed data bit is low, or logical 0, the PFET Q5 and the NFET Q7 are turned off, and the PFET Q8 and the NFET Q6 are turned on. This combination results in a logical 0 appearing at the driver output port 62. When the OE signal is high and the delayed data bit is high, or logical 1, the PFET Q5 and the NFET Q7 are turned on, and the PFET Q8 and the NFET Q6 are turned off. This combination results in a logical 1 appearing at the driver output port 62. Conventional combinatorial logic may be used to implement the truth table 70 in each of the predrivers 54.

Turning now to FIG. 6, a schematic diagram is shown of the current DAC 63 and the bias voltage generator 64. The current DAC 63 has an operational transconductance amplifier (OTA) with an output connected to gates of PFETs Q14, Q15, Q16, Q17, and Q18. An inverting input 74 of the OTA 72 is connected to a constant voltage source VREF. A non-inverting input 76 of the OTA 72 is connected to a drain of the PFET Q14 and to one end of a resistor 65. The other end of the resistor 65 is connected to the reference voltage VSS. The output of the OTA 72 provides a current proportional to a voltage difference across the non-inverting 74 and inverting 76 inputs. A drain of the PFET Q15 is connected to the supply voltage VDD and to the drains of the PFETs Q15, Q16, and Q18. The three lines of the delay time input 44 are connected to gates of PFETs Q19, Q20, and Q21, respectively. A source of the PFET Q19 is connected to a drain of the PFET Q15. A source of the PFET Q20 is connected to a drain of the PFET Q16. A source of the PFET Q21 is connected to a drain of the PFET Q17. Drains of the PFETs Q18-Q21 are connected together and provide a programmable current output 78.

Operation of the current DAC 63 will now be described. The PFET Q14 mirrors a current provided by the output of the OTA 72. A magnitude of the current is established by adjusting a resistance of the resistor 65. When the PFET Q19 is turned on by the first delay time input line 44-1, the PFET Q15 mirrors the current flowing through the PFET Q14. When the PFET Q20 is turned on by the second delay time input line 44-2, the PFET Q16 mirrors the current flowing through the PFET Q14. When the PFET Q21 is turned on by the third delay time input line 44-3, the PFET Q17 mirrors the current flowing through the PFET Q14. As the number of PFETs Q19-Q21 being turned on by the delay time input lines 44 increases, an increasing current flow is established through the programmable current output 78. The sizes of PFETs Q15-Q18 can be unequal to provide up to eight discrete levels of current flow through the programmable current output 78 in accordance with delay time input lines 44 turning on/off the PFETs Q19, Q20, and Q21.

In the bias voltage generator 64, the current flow from the programmable current output 78 is applied to a drain and a gate of an NFET Q22. A source of the NFET Q22 is connected to the reference voltage VSS, a source of an NFET Q23, and a source of an NFET Q24. A drain of the NFET Q23 is connected to a drain and a gate of a PFET Q25. A source of the PFET Q25 is connected to the voltage source VDD. A drain and a gate of the NFET Q24 are connected to a drain of a PFET Q26. A gate of the PFET Q26 is connected to the gate and the drain of the PFET Q25. A source of the PFET Q26 is connected to the supply voltage VDD. The drain of the PFET Q25 provides the positive bias voltage 66, and the drain of the NFET Q24 provides the negative bias voltage 68.

Operation of the bias voltage generator 64 will now be described. The current flow from the programmable current output 78 is mirrored by the NFET Q22. The NFET Q23 mirrors the current flowing through the NFET Q22. The PFET Q25 drops a voltage across its source and drain as it mirrors the current flowing through the NFET Q23. The drain of the PFET Q25 thereby provides the positive voltage 66 with VDD less the voltage dropped across PFET Q25. The PFET Q26 mirrors the current flowing through the PFET Q25. The NFET Q24 drops a voltage across its source and drain as it mirrors the current flowing through the PFET Q26. The drain of the NFET Q24 thereby provides the negative voltage 68 with a voltage equal to its source-drain voltage drop. The positive 66 and negative 68 bias voltages are applied to the delay cells 46.

Figure 7:
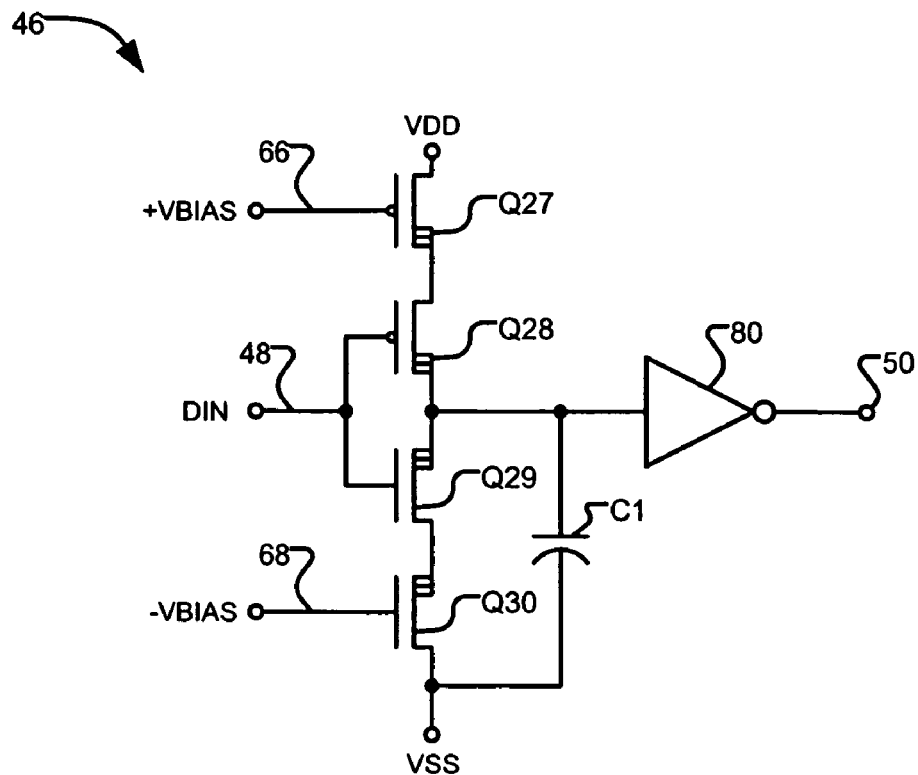
FIG. 7 is a schematic diagram of a delay cell of a delay stage.

Turning now to FIG. 7, a schematic diagram of a delay cell 46 is shown. A source of a PFET Q27 is connected to the supply voltage VDD. A gate of the PFET Q27 is connected to the positive bias voltage 66. A drain of the PFET Q27 is connected to a source of a PFET Q28. A gate of the PFET Q28 is connected to the data bit input 48 of the delay cell 46. A drain of the PFET Q28 is connected to a drain of an NFET Q29, to one end of a capacitor C1, and to an input of an inverter 80. The other end of the capacitor C1 is connected to the reference voltage VSS. A source of the NFET Q29 is connected to a drain of an NFET Q30. A gate of the NFET Q29 is connected to the data bit input 48 of the delay cell 46. A source of the NFET Q30 is connected to the reference voltage VSS. A gate of the NFET Q30 is connected to the negative bias voltage 68. An output of the inverter 80 provides the delayed data output 50.

Operation of the delay cell 46 will now be described. A magnitude of the positive 66 and negative 68 bias voltages establishes drain-source resistances of the PFET Q27 and the NFET Q30. If a logical 1 is applied to the data bit input 48, the PFET Q28 turns off and the NFET Q29 turns on, thereby allowing the capacitor C1 to discharge through the NFETs Q29 and Q30. A rate of discharge is determined by the magnitude of the negative bias voltage 68. With the capacitor C1 discharged, a logical 0 appears at the input of the inverter 80 and a logical 1 appears at the output of the inverter 80. The rate of discharge determines the delay time for the delay cell 46. Alternatively, if a logical 0 is applied to the data bit input 48, the NFET Q29 turns off and the PFET Q28 turns on, thereby allowing the capacitor C1 to charge through the PFETs Q27 and Q28. A rate of charge is determined by the magnitude of the positive bias voltage 66. When capacitor C1 is charged, a logical 1 appears at the input of the inverter 80 and a logical 0 appears at the output of the inverter 80. The rate of charge is preferably equal to the rate of discharge.

Figure 8:
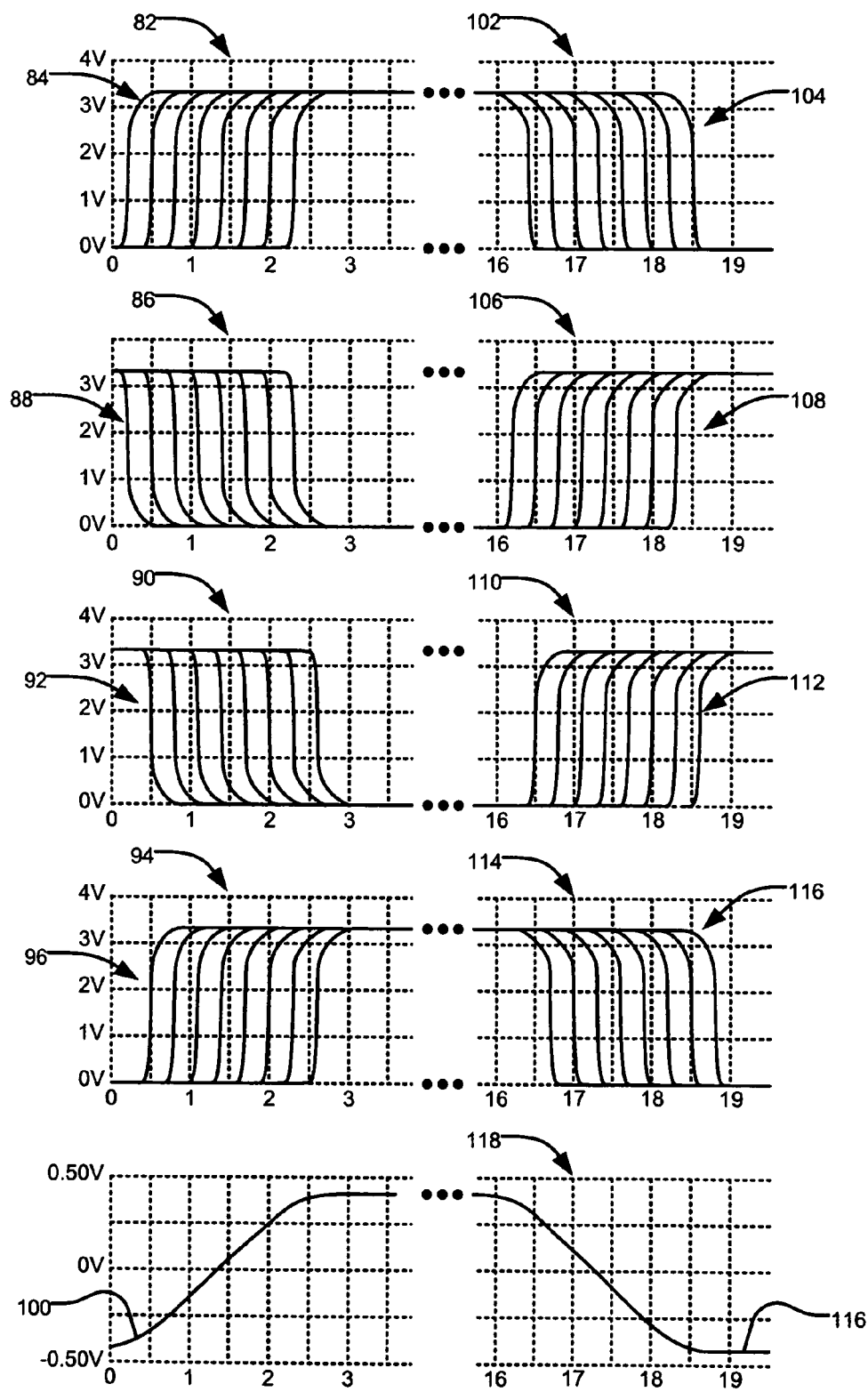
FIG. 8 illustrates signal diagrams of an output driver circuit.

Turning now to FIG. 8, waveforms are shown for an example output port circuit 40 having N=8 cascaded delay cells 46, predrivers 54, and drivers 58. A horizontal axis of each plot indicates time in nanoseconds and a vertical axis of each plot represents volts. The column of plots at a left side of FIG. 8 shows waveforms for a rising edge at the output port 42 caused by a logical 1 being applied to the data input 48-1 while the OE input 52 is high.

A plot 82 shows a set of time correlated curves 84 representing the output signals NN from the predrivers 54. Each output signal NN begins rising after its associated cascaded delay cell 46 propagates the logical 1 data bit.

A plot 86 shows a set of time correlated curves 88 representing the output signals PP from the predrivers 54. Each output signal PP begins falling after its associated cascaded delay cell 46 propagates the logical 1 data bit.

A plot 90 shows a set of time correlated curves 92 representing the output signals NP from the predrivers 54. Each output signal NP begins falling after its associated cascaded delay cell 46 propagates the logical 1 data bit.

A plot 94 shows a set of time correlated curves 96 representing the output signals PN from the predrivers 54. Each output signal PN begins rising after its associated cascaded delay cell 46 propagates the logical 1 data bit.

A plot 98 shows a signal voltage 100 rising at a controlled slew rate in unison with each driver output port 62 applying the logical 1 date bit to the output port 42. The signal voltage 100 rises as the drivers 58 activate in succession according to the output signals NN, PP, NP, and PN.

The column of plots at a right side of FIG. 8 shows waveforms for a falling edge at the output port 42 caused by a logical 0 being applied to the data input 48-1 while the OE input 52 is high.

A plot 102 shows a set of time correlated curves 104 representing the output signals NN from the predrivers 54. Each output signal NN begins falling after its associated cascaded delay cell 46 propagates the logical 0 data bit.

A plot 106 shows a set of time correlated curves 108 representing the output signals PP from the predrivers 54. Each output signal PP begins rising after its associated cascaded delay cell 46 propagates the logical 0 data bit.

A plot 110 shows a set of time correlated curves 112 representing the output signals NP from the predrivers 54. Each output signal NP begins rising after its associated cascaded delay cell 46 propagates the logical 0 data bit.

A plot 114 shows a set of time correlated curves 116 representing the output signals PN from the predrivers 54. Each output signal PN begins falling after its associated cascaded delay cell 46 propagates the logical 0 data bit.

A plot 118 shows a signal voltage 120 falling at a controlled slew rate in unison with each driver output port 62 applying the logical 0 data bit to the output port 42. The signal voltage 120 falls as the drivers 58 activate in succession according to the output signals NN, PP, NP, and PN.

A time between each successive rising edge and/or each successive falling edge in the families of curves is equal to the delay time of the cascaded delay cells 46.

Figure 9:
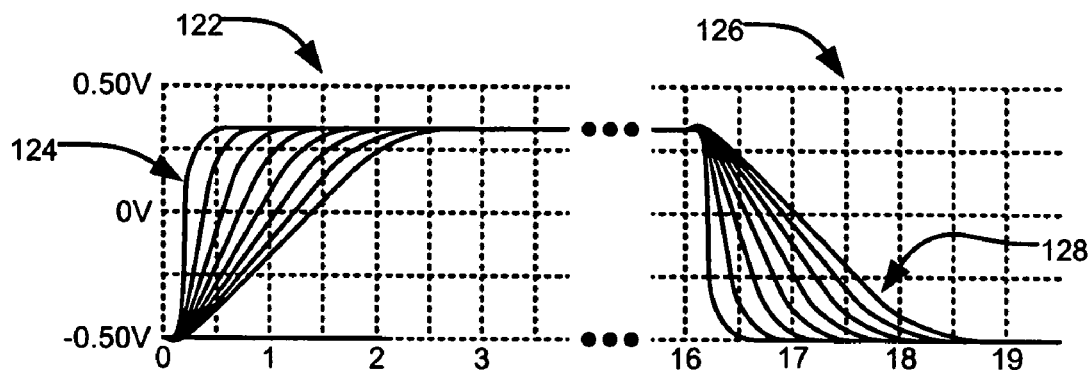
FIG. 9 illustrates a family of output signals of an output port.

Turning now to FIG. 9, families of waveforms are shown for the example output port circuit 40 having N=8 cascaded delay cells 46, predrivers 54, and drivers 58. Each of the cascaded delay cells 46 provide the delay time in accordance with the delay time signal 44. A horizontal axis of each plot indicates time in nanoseconds and a vertical axis of each plot represents volts. A plot 122 shows a family of eight rising edge waveforms 124. Each rising edge waveform is generated at the output port 42 with the cascaded delay cells 46 using a different one of eight discrete delay times. It can be seen from the family of rising edge waveforms 124 that increasing the delay time decreases the slew rate of the output port 42.

A plot 126 shows a family of eight falling edge waveforms 128. Each falling edge waveform is generated at the output port 42 with the cascaded delay cells using a different one of the eight discrete delay times. It can be seen from the family of rising edge waveforms 124 that decreasing the delay time increases the slew rate of the output port.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A small computer system interface (SCSI) driver circuit having a programmable slew rate, comprising:
   N cascaded delay cells, each including:
      a data bit input,
      a delayed data bit output that communicates with said data bit input of an adjacent one of said N cascaded delay cells, and
      a delay time input that receives a programmable delay time value for setting a variable delay between receiving data at said data bit input and generating said delayed data bit output;
   N predrivers that receive an output enable signal, which is independent of said data bit input, and a corresponding one of said N delayed data bit outputs and that generate a predriver output signal based on said output enable and said corresponding one of said N delayed data bit outputs;
   N drivers that have inputs that receive predriver output signals from corresponding ones of said N predrivers;
   an output port that communicates with outputs of said N drivers.

2. The SCSI driver circuit of claim 1 further comprising a delay control module that generates said delay times for said N cascaded delay cells.

3. The SCSI driver circuit of claim 1 wherein a bit of data input to a first of said N data bit inputs cascades through said N cascaded delay cells.

4. The SCSI driver circuit of claim 1 wherein said N drivers sequentially respond to said outputs of said N predrivers to provide said predetermined slew rate at said output port.

5. The SCSI driver circuit of claim 2 wherein said delay control module includes:
   a digital-to-analog converter (DAC) that receives a digital delay signal and that generates an analog delay signal; and
   a bias generator that receives said analog delay signal and that biases said N cascaded delay cells.

6. The SCSI driver circuit of claim 1 wherein each of said N cascaded delay cells further comprise a charge storage device that provides said delay time.

7. The SCSI driver circuit of claim 6 wherein said charge storage device includes a capacitor.

8. The SCSI driver circuit of claim 1 wherein said N drivers include H-bridges.

9. The SCSI driver circuit of claim 1 wherein each of said N drivers further comprises a current source.

10. The SCSI driver circuit of claim 9 wherein each of said N drivers further comprise a reference current source that provides a reference current for said current sources.

11. A computing device comprising a plurality of the SCSI drivers of claim 1.

12. The SCSI driver circuit of claim 1 wherein each of said N predrivers includes:
an enable input;
a predriver output; and
a mapping circuit that maps a corresponding one of said N delayed data bit outputs and said enable input to a corresponding predriver output signal.

13. A method for operating a small computer system interface (SCSI) driver circuit having a programmable slew rate, comprising:
providing N cascaded delay cells each including a data bit input, a delayed data bit output that communicates with said data bit input of an adjacent one of said N cascaded delay cells, and a delay time input;
programming a delay time value for setting a variable delay between receiving data at said data bit input and generating said delayed data bit output;
receiving an output enable signal, which is independent of said data bit input, and a corresponding one of said N delayed data bit outputs and generating a predriver output signal based on said output enable and said corresponding one of said N delayed data bit outputs;
coupling inputs of N drivers to predriver output signals from corresponding ones of said N predrivers; and
coupling an output port with outputs of said N drivers.

14. The method of claim 13 further comprising generating said delay times for said N cascaded delay cells.

15. The method of claim 13 further comprising cascading a bit of data input to a first of said N data bit inputs through said N cascaded delay cells.

16. The method of claim 13 further comprising sequentially responding to said outputs of said N predrivers to provide said predetermined slew rate at said output port.

17. The method of claim 14 further comprising:
receiving a digital delay signal;
generating an analog delay signal; and
receiving said analog delay signal and biasing said N cascaded delay cells based thereon.

18. The method of claim 13 further comprising using a charge storage device to produce said delay time.

19. The method of claim 17 wherein said charge storage device includes a capacitor.

20. The method of claim 13 wherein said N drivers include H-bridges.

21. The method of claim 13 further comprising mapping a corresponding one of said N delayed data bit outputs and said enable input to a corresponding predriver output signal.

22. A small computer system interface (SCSI) driver circuit having a programmable slew rate, comprising:
N cascaded delay means for delaying, each including:
a data bit input,
a delayed data bit output that communicates with said data bit input of an adjacent one of said N cascaded delay means, and
a delay time input that receives a programmable delay time value for setting a variable delay between receiving data at said data bit input and generating said delayed data bit output;

N predriving means for receiving an output enable signal, which is independent of said data bit input, and a corresponding one of said N delayed data bit outputs and for generating a predriver output signal based on said output enable and said corresponding one of said N delayed data bit outputs;
N driving means for driving that have inputs that receive predriver output signals from corresponding ones of said N predriving means;
an output port that communicates with outputs of said N driving means.

23. The SCSI driver circuit of claim 22 further comprising delay control means for generating said delay times for said N cascaded delay means.

24. The SCSI driver circuit of claim 22 wherein a bit of data input to a first of said N data bit inputs cascades through said N cascaded delay means.

25. The SCSI driver circuit of claim 22 wherein said N driving means sequentially respond to said outputs of said N predriving means to provide said predetermined slew rate at said output port.

26. The SCSI driver circuit of claim 23 wherein said delay control means includes:
converting means for receiving a digital delay signal and for generating an analog delay signal; and
bias generating means for receiving said analog delay signal and for biasing said N cascaded delay means.

27. The SCSI driver circuit of claim 22 wherein each of said N cascaded delay means further comprise charge storing means for providing said delay time.

28. The SCSI driver circuit of claim 27 wherein said charge storage means includes a capacitor.

29. The SCSI driver circuit of claim 22 wherein said N driving means include H-bridges.

30. The SCSI driver circuit of claim 22 wherein each of said N driving means further comprises current means for supplying current.

31. The SCSI driver circuit of claim 30 wherein each of said N driving means further comprise reference current means for providing a reference current for said current means.

32. A computing device comprising a plurality of the SCSI driver circuits of claim 22.

33. The SCSI driver circuit of claim 22 wherein each of said N predriving means includes:
an enable input;
a predriver output; and
mapping means for mapping a corresponding one of said N delayed data bit outputs and said enable input to a corresponding predrivers output signal.

34. A driver circuit having a programmable slew rate, comprising:
N cascaded delay means for delaying, each including:
a data bit input,
a delayed data bit output that communicates with said data bit input of an adjacent one of said N cascaded delay means, and
a delay time input that receives a programmable delay time value for setting a variable delay between receiving data at said data bit input and generating said delayed data bit output;
N predriving means for receiving an output enable signal, which is independent of said data bit input, and a corresponding one of said N delayed data bit outputs and for generating a predriver output signal based on said output enable and said corresponding one of said N delayed data bit outputs;

N driving means for driving that have inputs that receive predriver output signals from corresponding ones of said N predriving means;

an output port that communicates with outputs of said N driving means.

35. A driver circuit having a programmable slew rate, comprising:

N cascaded delay cells, each including:

a data bit input, a delayed data bit output that communicates with said data bit input of an adjacent one of said N cascaded delay cells, and a delay time input that receives a programmable delay time value for setting a variable delay between receiving data at said data bit input and generating said delayed data bit output;

N predrivers that receive an output enable signal, which is independent of said data bit input, and a corresponding one of said N delayed data bit outputs and that generate a predriver output signal based on said output enable and said corresponding one of said N delayed data bit outputs;

N drivers that have inputs that receive predriver output signals from corresponding ones of said N predrivers;

an output port that communicates with outputs of said N drivers.

36. A method for operating a driver circuit having programmable slew rate, comprising:

providing N cascaded delay cells each including a data bit input, a delayed data bit output that communicates with said data bit input of an adjacent one of said N cascaded delay cells, and a delay time input;

programming a delay time value for setting a variable delay between receiving data at said data bit input and generating said delayed data bit output;

receiving an output enable signal, which is independent of said data bit input, and a corresponding one of said N delayed data bit outputs and generating a predriver output signal based on said output enable and said corresponding one of said N delayed data bit outputs;

coupling inputs of N drivers to predriver output signals from corresponding ones of said N predrivers; and coupling an output port with outputs of said N drivers.

37. The SCSI driver circuit of claim 1 wherein each of said N predrivers generate a plurality of predriver output signals based on said output enable signal and one of said N delayed data bit outputs.

38. The SCSI driver circuit of claim 37 wherein each of said N drivers receive said plurality of predriver output signals.

39. The SCSI driver circuit of claim 1 wherein said N drivers operate in a 3-state or a binary state based on said output enable signal.

40. The SCSI driver circuit of claim 1 wherein said predriver output signal is the same as one of said N delayed data bit outputs or one of said N predrivers are in a 3-state based on said output enable signal.

* * * * *

UNITED STATES PATENT AND TRADEMARK OFFICE
CERTIFICATE OF CORRECTION

PATENT NO. : 7,298,173 B1  Page 1 of 1
APPLICATION NO. : 11/122444
DATED : November 20, 2007
INVENTOR(S) : Bin Jiang et al.

It is certified that error appears in the above-identified patent and that said Letters Patent is hereby corrected as shown below:

Column 2, Line 7     Delete "0.5V" and insert -- -0.5V --
Column 5, Line 17    Delete "is" after "column"

Signed and Sealed this

Sixth Day of May, 2008

JON W. DUDAS
*Director of the United States Patent and Trademark Office*